United States Patent [19]

Hollyday

[11] 4,215,326

[45] Jul. 29, 1980

[54] FILTERED ADAPTER

[75] Inventor: Robert D. Hollyday, Hershey, Pa.

[73] Assignee: AMP Incorporated, Harrisburg, Pa.

[21] Appl. No.: 869,550

[22] Filed: Jan. 16, 1978

[51] Int. Cl.[2] .................. H03H 7/04; H01R 33/80; H01R 13/66

[52] U.S. Cl. .................. 333/182; 333/183; 339/143 R; 339/147 R

[58] Field of Search .................. 333/70 R, 79, 73 C, 333/70 S, 181-185; 339/136 R, 136 M, 139 R, 139 C, 143 R, 147 R, 217 R, 218 R, 218 C, 91 R, 275 R, 275 C, 277 C, 278 A, 204; 361/301-309

[56] References Cited

U.S. PATENT DOCUMENTS

| | | | |
|---|---|---|---|
| Re. 29,258 | 6/1977 | Fritz | 333/70 S |
| 3,065,447 | 10/1962 | Maurer | 339/184 |
| 3,101,229 | 8/1963 | Yopp | 339/59 |
| 3,440,597 | 4/1969 | Baker et al. | 339/221 |
| 3,467,944 | 9/1969 | Hammell et al. | 339/125 |
| 3,566,336 | 2/1971 | Johnson et al. | 333/91 |
| 3,573,677 | 4/1971 | Detar | 333/79 |
| 3,743,978 | 7/1973 | Fritz | 333/79 |
| 3,758,935 | 9/1973 | Long et al. | 29/203 |
| 3,840,841 | 10/1974 | Clark | 339/147 P |
| 3,854,107 | 12/1974 | Tuchto et al. | 333/79 |
| 3,961,294 | 6/1976 | Hollyday | 333/79 |
| 4,126,840 | 11/1978 | Selvin | 333/70 S |
| 4,144,509 | 3/1979 | Boutros | 333/181 |

*Primary Examiner*—Marvin L. Nussbaum
*Attorney, Agent, or Firm*—Russell J. Egan

[57] ABSTRACT

A filtered adapter is disclosed for interconnecting existing mating connectors thereby providing filtered retrofit of a connector without the need for major circuit modification.

8 Claims, 2 Drawing Figures

FILTERED ADAPTER

BACKGROUND OF THE INVENTION

1. The Field of the Invention

The present invention relates to a filtered interconnection adapter to be inserted between existing mating connector members to retrofit a circuit with the desired filtering characteristics.

2. The Prior Art

There are often instances when circuitry is initially designed without filtering being provided in the interconnecting faces. However, after experience with the circuitry it becomes apparent that such filtering would be highly desirable and yet would be rather costly if circuitry redesign were to be necessitated. Therefore, it becomes highly desirable to provide a means for retrofitting filtering into the circuit to avoid excessive redesign cost while achieving the desired ends.

SUMMARY OF THE INVENTION

The present invention concerns an adapter to retrofit filtering into existing mating connectors and includes a first flanged shell member having a ground plane secured intermediate thereof with a plurality of apertures therein. A plurality of filter sleeves are secured in the respective apertures of the ground plane. A like plurality of terminals, each having a pin configuration on a first end and a socket configuration on the opposite end, are provided each secured in a respective filter sleeve. The flanged shell, with the filters and contacts mounted therein, is filled on opposite sides of the ground plane with an insulating potting material and/or an insulation coating and/or an insulating insert and mating connector shells are secured to the flanges to form an integral unit having on one end a receptacle configuration and the other end a plug configuration.

It is therefore an object of the present invention to produce a filtered adapter for retrofitting existing connector assemblies without requiring modification of existing circuitry and/or connector equipment.

It is a further object of the present invention to produce a filtered adapter which can be readily and economically produced.

The means for accomplishing the foregoing objects and other advantages of the present invention will become apparent to those skilled in the art from the following detailed description taken with reference to the accompanying drawings.

DETAILED DESCRIPTION OF THE PREFERRED EMBODIMENT

Figure 2:
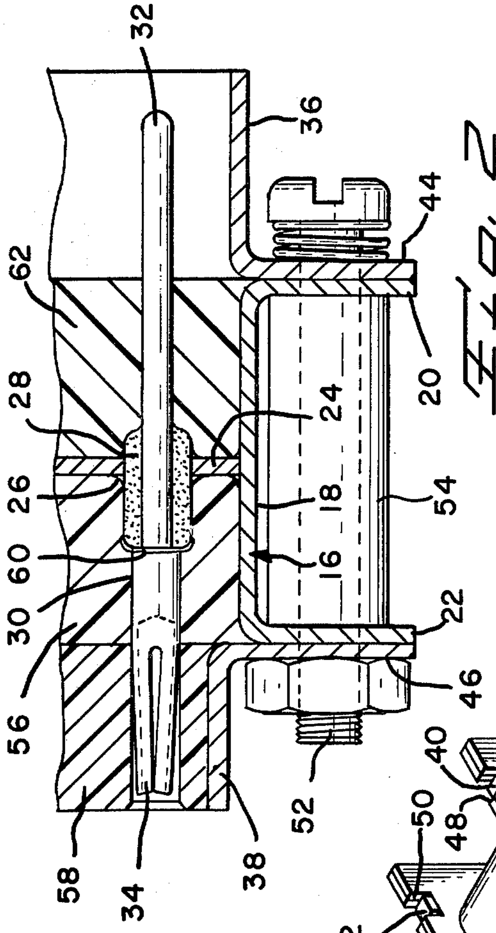
FIG. 2 is a partial transverse section taken along line 2—2 of FIG. 1.
Figure 1:
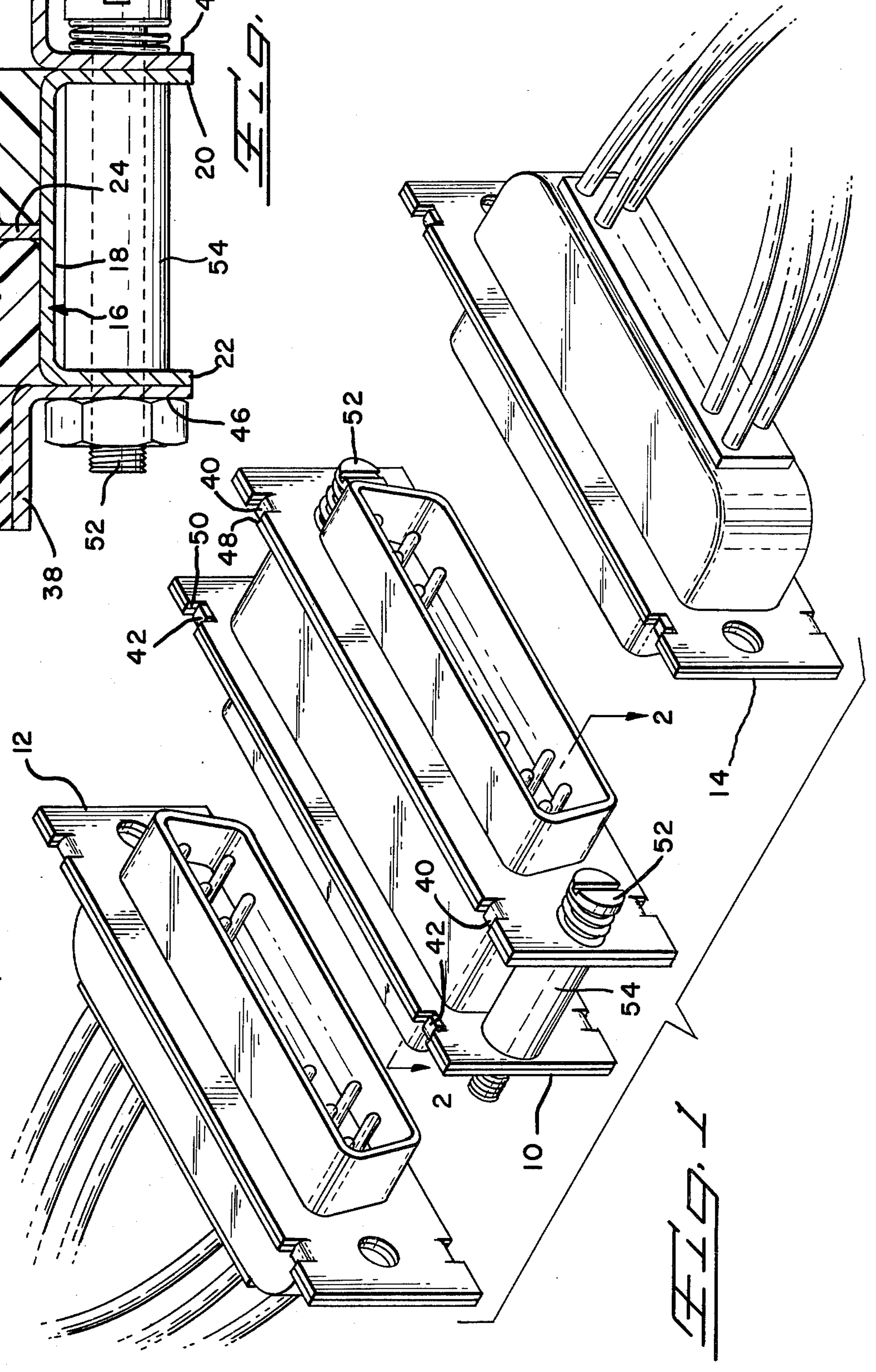
FIG. 1 is an exploded perspective view of the subject filtered adapter and mating connector members.

The subject filtered adapter invention is shown in FIG. 1 exploded from the mating members 12, 14 of a connector with the opposite faces of the adapter 10 profiled to appropriately mate with the connector members. The mating connector members 12, 14 are shown having a configuration similar to that disclosed in U.S. Pat. No. 3,101,229, however, any suitable connector assembly configuration may be used such as those described in U.S. Pat. Nos. 3,065,447 and 3,758,935. Since the mating connector members are of well known configurations, no detailed description of them is deemed necessary.

Turning now to the subject adapter 10, the adapter includes a flanged shell 16 having a substantially rectangular center portion 18 with outwardly directed flanges 20, 22 extending about the entire front and rear peripheries, respectively, thereof. The portion 18 is substantially bisected by a ground plane 24 which is secured thereto. The ground plane has a plurality of apertures 26 therein with the apertures being in alignment with the pin configuration for the mating connector members 12, 14. A filter sleeve 28 is secured in each aperture 26 by conventional soldering or other known methods. The filter sleeve is preferably of the type disclosed by U.S. Pat. Re No. 29,258, the disclosure of which is incorporated herein by reference. A terminal 30, having a pin configuration 32 on a first end and a socket configuration 34 on the opposite end is secured in each filter sleeve 34 by soldering or other known means. The terminal 30 is of any known configuration, such as the terminals described in U.S. Pat. Nos. 3,440,597 and 3,467,944.

Suitably profiled shells 36 and 38 are secured on opposite sides of the flange shell 16 by means of clinching tines 40, 42 formed in flanges 44, 46, respectively, and engaging in notches 48, 50 in flanges 20, 22. The bolts 52 extending through mating flange portions 44, 20, 22, 26 are used to secure the adapter to a ground plane represented by sleeve 54, and locating the adapter between mating connector members 12, 14. Longer bolts could be used to fix the connector members and adapter together as a unit. The cavity defined by the shell 38 and half of the shell 16 is filled with a potting material 56 and/or an insulating insert 58 and/or a coating material 60 while the cavity defined the other half of the shell 16 is filled with a similar potting material 62.

The adapter is thus provided with oppositely directed configurations suitable for intermating with the plug and receptacle members 12, 14, respectively. The adapter is readily inserted into a system simply by unplugging the existing connector members and mating them with the respective sides of the adapter.

The present invention may be subject to many changes and modifications without departing from the spirit or essential characteristics thereof. The present embodiment is therefore, intended in all respects to be illustrative and not restrictive of the scope of the invention.

What is claimed is:

1. A filtered adapter for retrofitting existing electrical connectors of known configurations to provide RFI/EMI filtering, comprising:

a housing member having an overall profile matable with a known electrical eonnector and having oppositely directed mating sides, an outwardly directed flange extending from the periphery of each said mating side, said flanges being spaced substantially parallel to each other, a ground plane secured to and extending across said member substantially intermediate the mating sides thereof, said ground plane having a plurality of apertures therein each aligned with a respective terminal of said known electrical connector;

a like plurality of filter sleeves each secured in a respective one of said apertures of said ground plane;

a like plurality of terminals each mounted in a respective one of said filter sleeves, each said terminal having a pin configuration on a first end and socket configuration on the opposite end;

a profiled shell secured to and extending outwardly from each said mating side of said housing member and providing a profile for mating with said known electrical connector;

an outwardly directed flange extending from the periphery of each said profiled shell abutting against said flange of a corresponding said mating side, each said mating side flange and said shell flange thereagainst having at least one aperture therethrough in alignment with said at least one aperture of said opposite mating side and said shell flange and securing means extending through said apertures to secure said profiled shells to said housing member flanges and connect said ground plane to ground.

2. A filtered adapter according to claim 1 further comprising:

potting material substantially filling said housing member to at least the mating side on one side of the ground plane and into the profiled shell on the other side of the ground plane.

3. A filtered adapter according to claim 1 further comprising:

an insert of insulation material substantially filling said housing to at least the mating side on one side of the ground plane, and a second insert of insulation material substantially filling the housing from the other side of said ground plane into said profiled shell.

4. A filtered adapter according to claim 1 further comprising:

an insulative coating material applied to said filter sleeves and ground plane on both sides thereof.

5. A filtered adapter according to claim 1 wherein said housing member has a generally rectangular configuration.

6. A filtered adapter according to claim 1 wherein said housing member has a circular configuration.

7. A filtered adapter according to claim 1 further comprising:

means to latchingly secure said connector to said adapter..

8. An electrical connector comprising:

a housing formed of a central shell with outwardly peripherial flanges forming oppositely directed mating faces, and two end shells each having an outwardly directed flange portion which overlies a flange of the central shell and an axially directed hood portion shaped to mate with a respective matable connector member and means to secure said flange portions of said end shells to the respective flanges of said central shell;

an apertured electrically conductive ground plane member secured within the housing;

means to connect said ground plane member to ground;

a plurality of tubular filter members each having isolated electrodes on their inner and outer surfaces, each filter member being secured in an individual aperture in the ground plane member with the outer surface electrode of the filter member in electrical contact with the ground plane member;

a plurality of electrical terminals each passing through an individual one of the filter members in electrical contact with the inner surface electrode of the filter member, each terminal having two oppositely directed matable contact portions; and electrical insulative material filling said central shell on both sides of said ground plane member at least to said flanges encapsulating said filter members therein, whereby the connector can be interposed between a pair of matable electrical connectors to provide filtering on electrical circuits passing through the matable electrical connectors.

* * * * *